United States Patent
Keating

[11] Patent Number: 5,828,237
[45] Date of Patent: Oct. 27, 1998

[54] EMITTER COUPLED LOGIC (ECL) GATE AND METHOD OF FORMING SAME

[75] Inventor: Pierce V. Keating, Pompano Beach, Fla.

[73] Assignee: Motorola, Inc., Schaumburg, Ill.

[21] Appl. No.: 656,543

[22] Filed: May 31, 1996

[51] Int. Cl.⁶ .................................................. H03K 19/086
[52] U.S. Cl. ............................ 326/126; 326/18; 326/125
[58] Field of Search ..................................... 326/126–127, 326/18, 22, 26, 125; 327/65, 307

[56] References Cited

U.S. PATENT DOCUMENTS

| | | | |
|---|---|---|---|
| 4,516,039 | 5/1985 | Matsuzaki et al. | 326/127 |
| 4,546,272 | 10/1985 | Suzuki et al. | 326/126 |
| 4,675,553 | 6/1987 | Price et al. | 326/126 |
| 4,714,841 | 12/1987 | Shoji et al. | 326/126 |
| 4,928,024 | 5/1990 | Shimotsuhama et al. | 326/126 |
| 5,079,452 | 1/1992 | Lain et al. . | |
| 5,220,212 | 6/1993 | Sinh . | |
| 5,289,055 | 2/1994 | Razavi . | |
| 5,315,176 | 5/1994 | Popescu | 326/126 |

OTHER PUBLICATIONS

Razavi, B., Ota, Y., Swartz R. G., "Design Techniques for Low–Voltage High Speed Digital Bipolar Circuits," IEEE, Journal of Solid–State Circuits, vol, 29, No.3, Mar. 1994.

Horenstein. *Microelectronic Circuits and Devices*. Prentice Hall, 1990. pp. 492–497 and 785–786.

*Primary Examiner*—Jon Santamauro
*Attorney, Agent, or Firm*—Barbara R. Doutre

[57] ABSTRACT

A fully differential, low voltage ECL gate (300) receives complementary logic signals (A, Ax, B, Bx) and provides them to first and second differential pairs (306, 318). Collectors from different differential pairs (306) and (318) are coupled together and provided with independent current paths through load resistors, R1, (336) and R2 (338). Differential outputs (OUT, OUTx) are generated at the common collector nodes (344, 346). The load resistors (336, 338) are selected to control the gain and ensure that a minimum switching threshold ($V_{th}$) is maintained under all differential input signal conditions of (A, Ax, B, and Bx) for a logical AND or OR function.

12 Claims, 3 Drawing Sheets

EMITTER COUPLED LOGIC (ECL) GATE AND METHOD OF FORMING SAME

TECHNICAL FIELD

This invention relates in general to digital bipolar logic circuits, and more particularly emitter coupled logic circuits.

BACKGROUND

In integrated circuit designs using low supply voltages, a designer is severely constrained with regard to stacking devices within a circuit. For emitter coupled logic (ECL) circuits, the transistor stacking constraint often rules out many traditional current steering topologies. Some existing non-stacked ECL structures make use of single ended inputs, however single ended input topologies compromise the noise immunity provided for in conventional higher supply voltage ECL structures.

Referring to FIG. 1, there is shown a prior art ECL circuit 100 which utilizes two sets of stacked differential amplifiers 102, 104. A disadvantage associated with ECL circuit 100 is that the voltage drop from the collector to emitter (VCE) associated with each transistor pair is added to the required voltage across the load and bias elements. The use of stacked transistors 102, 104 thus requires a higher supply voltage, Vcc. Furthermore, a level shifting operation must be performed on input signals B and Bx which requires the use of an additional buffer/level shifting stage 106. The additional buffer stage 106 increases the integrated surface area and cost of performing a logic function.

FIG. 2 is a prior art ECL circuit 200 which avoids the use of stacked transistors. A drawback of the ECL circuit 200 is that it utilizes supply referenced single ended input signals A and B, which generally results in inferior noise immunity. Another drawback associated with circuit 200 is that it requires the use of a voltage reference, Vref, 202 to establish a switching point for the input signals A and B. Additional current and surface area are required to implement the voltage reference 202.

Accordingly, there is need for an ECL circuit which is capable of performing a logic function, such as a logical AND or OR, at low supply voltages while minimizing the use of stacked transistors.

DETAILED DESCRIPTION OF THE PREFERRED EMBODIMENT

Figure 1:
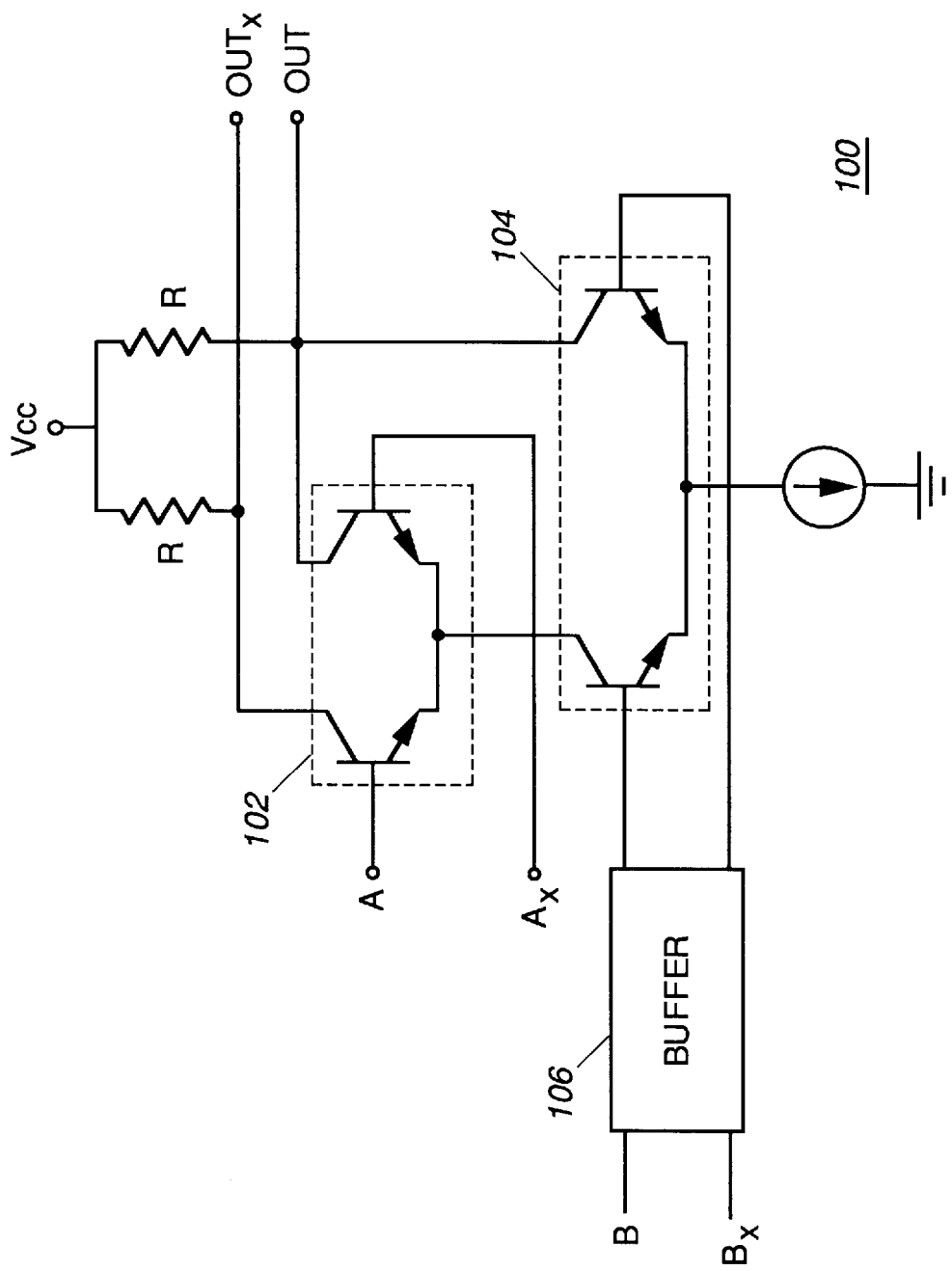
FIG. 1 is a prior emitter coupled logic circuit.
Figure 2:
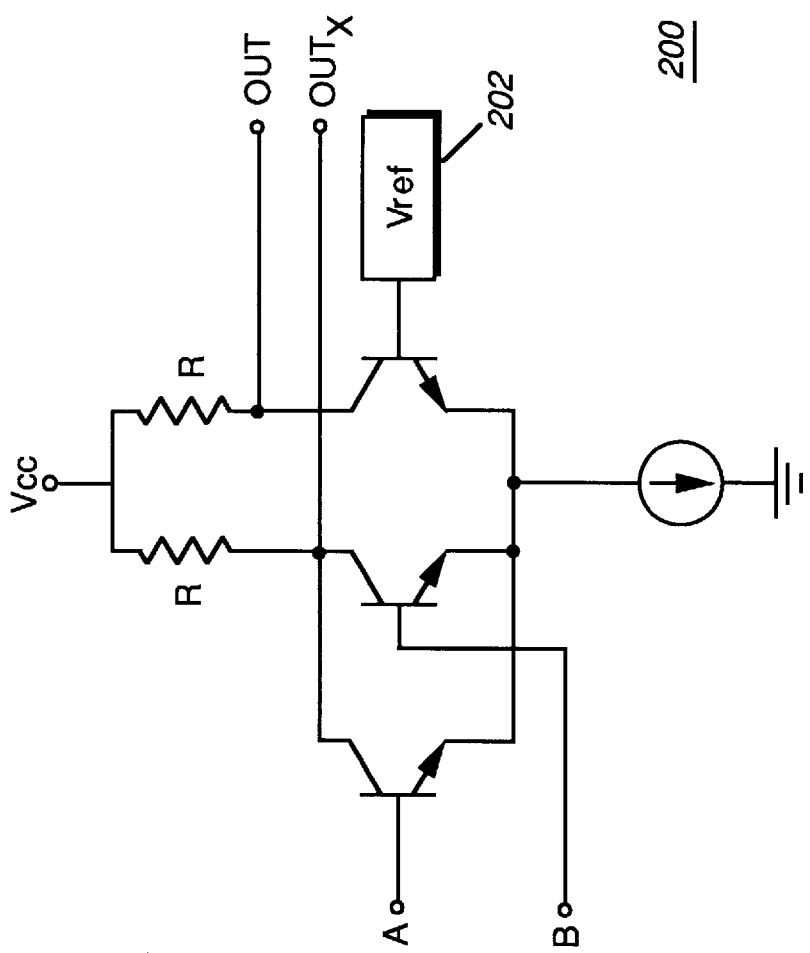
FIG. 2 is a prior art emitter coupled logic circuit.
Figure 3:
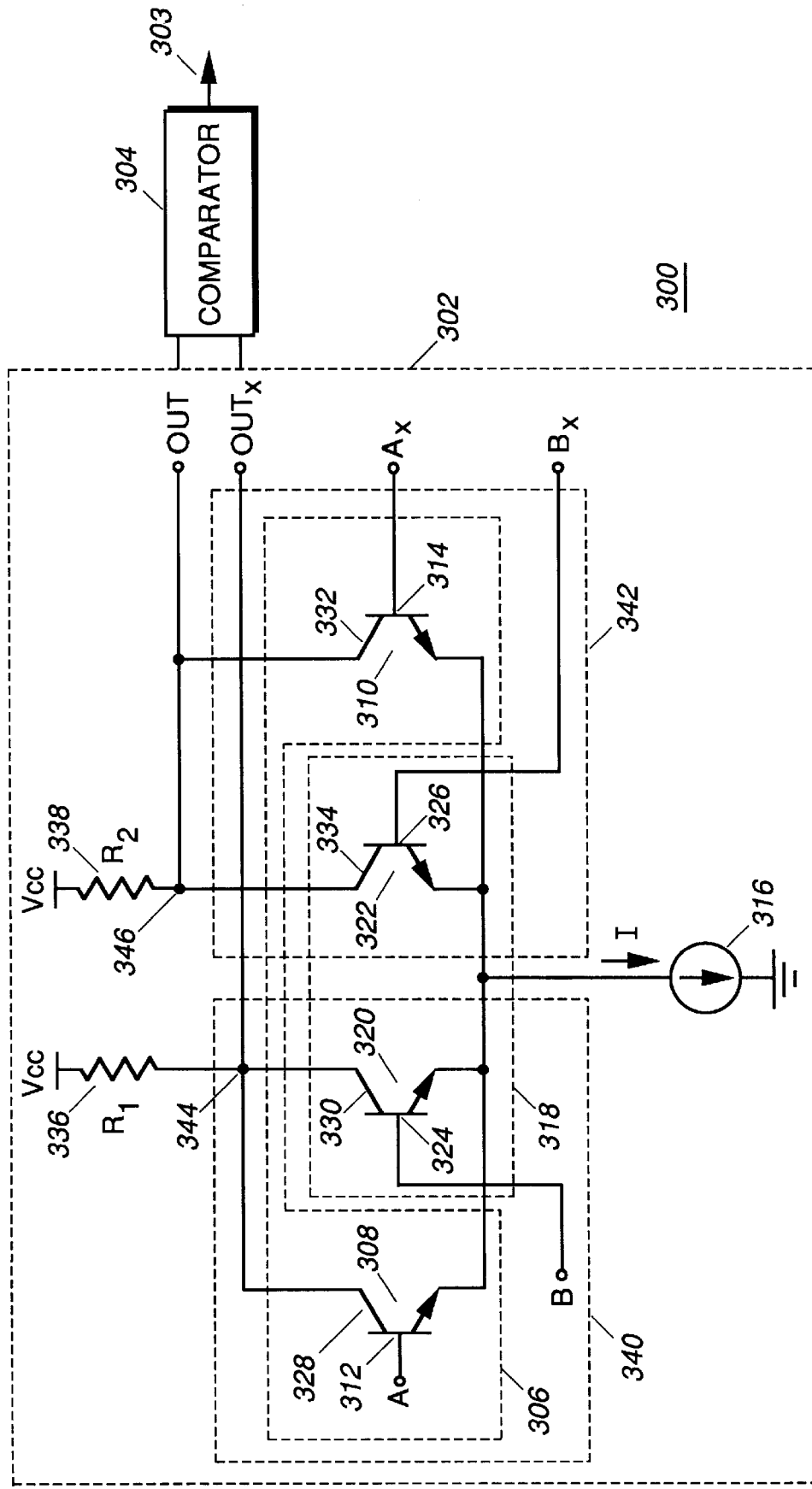
FIG. 3 is an emitter coupled logic circuit in accordance with the present invention.

Referring now to FIG. 3, there is shown an emitter coupled logic (ECL) gate 300 which provides either an AND gate or an OR gate in accordance with the present invention. ECL gate 300 includes an exclusionary ECL circuit 302 which, in accordance with the present invention, receives complementary logic signals A, Ax, B, and Bx and generates exclusionary output signals, OUT and OUTx. The exclusionary output signals, OUT, OUTx are differential signals which can be at multiple voltage levels. Output signals OUT, OUTx are preferably applied to a comparator 304 to convert the multiple voltage levels into two level complementary signals. The exclusionary ECL circuit 302 of the present invention operates under low voltage conditions, such as 1.4 volts. For the purposes of this application, an exclusionary function is defined as a function which can take all combinations of binary logic signals and convert them to output signals, which, when compared to each other, result in equivalent logic signals for all input combinations except one. In accordance with the present invention, the output signals OUT, OUTx of exclusionary ECL circuit 302 provide differential outputs which meet or exceed the minimum required voltage differential to switch the inputs of further ECL circuits.

The exclusionary ECL circuit 302 of the present invention generates differential output voltage signals (OUT and OUTx), one of which is larger than the other under all complementary input signal combinations of A, Ax, B, Bx but one. These differential output signals OUT, OUTx are preferably applied as inputs to the comparator 304 to provide two level, logic level outputs 303 in either an AND gate or an OR gate function.

In accordance with the preferred embodiment of the invention, exclusionary ECL circuit 302 includes a first differential pair 306 formed of first and second emitter coupled transistors 308, 310 receiving complementary logic signals A, Ax through their respective bases 312, 314. The voltages of complementary logic signals A, Ax control the conduction states of transistors 308, 310 respectively. A current sink 316, such as a direct current (DC) biased bipolar junction transistor (BJT), is coupled to the emitters of transistors 308, 310 for sinking a current, I, through the conductive path.

In accordance with the preferred embodiment of the invention, exclusionary ECL circuit 302 further includes a second differential pair 318 formed of first and second emitter coupled transistors 320, 322 receiving complementary input signals B, Bx through their respective bases 324, 326. The voltages of complementary input signals B, Bx control the conduction states of transistors 320, 322 respectively. Current sink 316 is coupled to the emitters of transistors 320, 322 for sinking the current, I, through the conductive path.

In accordance with the present invention, each half 340, 342 of the first and second differential pairs 306, 318 are coupled through common collectors at first and second common collector nodes 344, 346 respectively. Collector 328 of transistor 308 of the first differential pair 306 is coupled to collector 330 of transistor 320 of the second differential pair 318. Collector 332 of transistor 310 of the first differential pair 306 is coupled to collector 334 of transistor 322 of the second differential pair 318.

In accordance with the present invention, a first resistive load, preferably a resistor $R_1$, 336 is coupled between supply, Vcc, and the common collectors 328, 330 to provide an independent gain control for one half 340 of the differential pairs. A second resistive load, preferably a resistor $R_2$, 338 is coupled between supply, Vcc, and the common collectors 334, 332 to provide independent gain control to the other half 342 of the differential pairs. Differential outputs are taken from the common collector nodes 344, 346. First and second resistive loads 336, 338 control and set the gains for the first and second halves 340, 342 of the differential pairs.

In accordance with the present invention, first and second resistive loads 336, 338 are selected to generate a voltage differential between signals OUT, OUTx which provides at least the minimum differential threshold voltage required to switch an ECL gate under all complementary logic input combinations. Differential output signals OUT, OUTx are preferably provided to comparator 304 and based on the thresholds set for the comparator, a logical OR function or a logical AND function is provided.

Briefly, according to the present invention, each half of the differential pairs 340, 342 are configured into first and second wired OR circuits coupled through common emitters into a single differential circuit. Each wired OR circuit makes up one half 340 or 342 of the differential circuit and generates a logic level output, OUT, OUTx. The voltage differential generated between the two outputs OUT, OUTx provides a sufficient threshold for a valid logic state, even when the two OR circuits are simultaneously conducting current.

In accordance with the present invention, ECL gate 300 is formed by coupling collectors from different differential pairs and adjusting separate gain factors for each half 340, 342 of the differential circuit through the first and second resistive loads, 336, 338. Adjusting the gain factors to be dissimilar allows for the simultaneous conduction of current through both of the loads 336, 338 and half of the differential circuit 340, 342 when an appropriate combination of complementary input signals exist. In accordance with the present invention, the gain factors are selected to provide for a valid voltage differential sufficient to control the minimum switching threshold required for a logical state.

The table below summarizes the outputs available for the circuit shown in FIG. 3.

TABLE 1

| combination | A | B | Ax | Bx | OUT | OUTx |
|---|---|---|---|---|---|---|
| (1) | 0 | 0 | 1 | 1 | Vcc-IR$_2$ | Vcc |
| (2) | 1 | 0 | 0 | 1 | Vcc-(I/2)R$_2$ | Vcc-(I/2)R$_1$ |
| (3) | 0 | 1 | 1 | 0 | Vcc-(I/2)R$_2$ | Vcc-(I/2)R$_1$ |
| (4) | 1 | 1 | 0 | 0 | Vcc | Vcc-IR$_1$ |

In order to provide a differential output voltage that meets the minimum threshold requirement for a valid logical state under all input conditions, consider the following when selecting the gain factors associated with the different current paths:

$V_{th}$, will be referred to as that minimum voltage required for a logical state, and all outputs of OUT, OUTx need at least a delta of this minimum threshold, $V_{th}$, under all input conditions, for A=B=high voltage, $R_1(I)=V_{th}$, for A≠B, $R_1(I/2)+V_{th} = R_2(I/2)$, now, solving for R2, R2=3R1

Thus, the resistor ratio in this case is required to be at least three to one. However, one skilled in the art recognizes that the ECL circuit of the present invention is not limited to two differential pairs and that as more pairs are added, the gain can be adjusted accordingly. While shown and described in terms of NPN transistors, the ECL circuit of the present invention can also be implemented using PNP transistors. Combinations (2) and (3) of Table 1 provide the logic input signals in which current is simultaneously sourced through each load resistor 336, 338. Selecting the gain factors to meet the minimum threshold requirements allows for valid logic levels to be generated even when current is being conducted simultaneously through both halves 340, 342 of the ECL circuit 302.

Notice that output signal "OUT" follows the functional equivalent of an "AND" gate by itself. Thus, the outputs generated in Table 1 can also alternatively be used as single ended inputs to another circuit. When used as a single ended input, the comparator 304 is not required. Comparator 304 aids in converting the multi-level voltage outputs into two voltage level logic levels for other ECL gates.

By comparing the outputs, OUT to OUTx, of Table 1, it can be seen that for all complementary input signal combinations except one (combination 4) that output, OUT, is less than OUTx. These outputs, OUT, OUTx, provided by exclusionary ECL circuit 302 meet the minimum required voltage differential to switch the inputs of further ECL circuits. Therefore, the outputs OUT, OUTx provide exclusionary differential output signals under all combinations of the complementary logic signals.

If the comparator 304 sets a threshold that OUT being greater than OUTx generates a logic level high then the outputs of comparator 304 for the first (1) through fourth (4) input combinations described in Table 1 are (0, 0, 0, 1) respectively. Since the complementary input signals A, Ax, B, Bx operate as binary signals, the ECL gate 300, under these conditions, provides the functional equivalent of an AND gate.

If, on the other hand, the comparator 304 sets a threshold that OUTx being greater than output OUT provides a logic level high and complementary inputs are viewed as inverted, then the outputs of comparator 304 are (1, 1, 1, 0) for the first (1) through the fourth (4) input combinations. Therefore, ECL gate 300 can also provide the functional equivalent of an OR gate.

Accordingly, there has been described a fully differential ECL gate 300 which generates differential outputs which can be used to provide an OR gate or an AND gate configuration. The ECL gate 300 described by the invention minimizes the use of stacked transistors while utilizing complementary inputs and providing differential outputs. The differential output signals of exclusionary ECL circuit 302 provide the minimum required voltage differential to switch the inputs of further ECL circuits.

By coupling collectors (328, 330), (332, 334) from different differential pairs 306, 318 and providing independent gain controls to the common collectors, an ECL gate providing a logical AND or OR function has been provided. Setting or adjusting the independent gain controls to meet or exceed a predetermined differential threshold level ensures a valid logic state under all combinations of complementary inputs. The ECL circuit of the present invention provides valid logic levels even when current is being simultaneously sourced through each load 336, 338. Prior art circuits and techniques typically switch all the current through a single load and do not allow such a condition to exist. Also, by providing a fully differential ECL circuit, the noise immunity is improved over the single ended input technique of the prior art.

The ECL gate of the present invention has the advantage of being fully differential and provides the benefit of reduced current drain in a low voltage environment. The ECL gate 300 described by the invention eliminates the need for a separate reference voltage and minimizes the use stacked transistors and is thus well suited for low voltage bipolar integrated platforms, especially those where space constraints are critical.

Numerous modifications, changes, variations, substitutions, and equivalents will occur to those skilled in the art without departing from the spirit and scope of the present invention as defined by the appended claims.

What is claimed is:

1. An emitter coupled logic (ECL) circuit, including:

first and second differential pairs biased by complementary logic signals having substantially equal voltage levels, the first and second differential pairs being configured into first and second wired OR circuits coupled together through common emitters;

a current sink coupled to the common emitters of the wired OR circuits;

first and second resistive loads coupled to each of the first and second wired OR circuits respectively, the first resistive load controlling a gain for the first wired OR circuit and the second resistive load controlling a gain for the second wired OR circuit, the gain of the first wired OR circuit being dissimilar to the gain of the second wired OR circuit;

first and second differential outputs generated at the first and second resistive loads in response to the complementary logic signals, the gain of the first wired OR circuit, and the gain of the second wired OR circuit; and a comparator for receiving the differential outputs and providing a logic level output.

2. An ECL circuit as described in claim 1, wherein the ECL circuit comprises an AND gate.

3. An ECL circuit as described in claim 1, wherein the ECL circuit comprises an OR gate.

4. An emitter coupled logic (ECL) circuit, including:

first and second differential pairs biased from first and second complementary logic signals having substantially equal voltage levels respectively, each half of the first and second differential pairs being coupled through a common collector;

first and second resistive loads coupled to the common collectors of each half of the differential pairs, the first and second resistive loads setting first and second gain factors respectively;

first and second differential output signals being generated at the common collectors of the first and second differential pairs in response to the first and second gain factors and the first and second complementary logic signals; and a comparator for comparing the first and second differential output signals.

5. An ECL circuit as described in claim 4, wherein the ECL circuit comprises an AND gate.

6. An ECL circuit as described in claim 4, wherein the ECL circuit comprises an OR gate.

7. An emitter coupled logic (ECL) gate, comprising:

at least two differential pairs of transistors biased by complementary logic signals having substantially equal voltage levels, wherein collectors from different differential pairs are coupled together to form first and second common collector nodes;

first and second resistive loads coupled to the first and second common collector nodes respectively, said first and second resistive loads providing independent and simultaneous gain control of the at least two differential pairs;

the first and second common collector nodes providing differential output signals in response to the complementary logic signals and the independent and simultaneous gain control of the at least two differential pairs; and a comparator for comparing the differential output signals and providing a logic level output.

8. An ECL logic gate as described in claim 7, wherein the ECL gate comprises an AND gate.

9. An ECL logic gate as described in claim 7, wherein the ECL logic gate comprises an OR gate.

10. An ECL logic gate as described in claim 7, wherein the first and second resistive loads set first and second gain factors controlling a predetermined threshold level for switching said ECL logic gate.

11. A method of forming an emitter coupled logic (ECL) gate, including the steps of:

providing a plurality of differential pairs of transistors receiving complementary logic signals having substantially equal voltage levels;

coupling emitters of the plurality of differential pairs together;

coupling collectors from different differential pairs into first and second common collector nodes;

setting first and second independent gain controls at the first and second common collector nodes respectively;

sinking current at the coupled emitters;

generating differential outputs at the first and second common collector nodes in response to the complementary logic signals and the first and second independent gain controls; and comparing the differential outputs to provide a logic level output.

12. A method of forming an ECL gate as described in claim 4, wherein the step of setting first and second independent gain controls includes the steps of selecting first and second resistive loads which provide a predetermined threshold level for switching a logic gate.

* * * * *